United States Patent [19]
Geddes et al.

[11] Patent Number: 5,152,805
[45] Date of Patent: Oct. 6, 1992

[54] M-I-M' DEVICE AND FABRICATION METHOD

[75] Inventors: Norman J. Geddes, San Jose, Calif.; Daniel J. Sandman, Acton, Mass.; John R. Sambles, Crediton; William G. Parker, Exeter, both of England

[73] Assignee: GTE Laboratories Incorporated, Waltham, Mass.

[21] Appl. No.: 702,254

[22] Filed: May 17, 1991

Related U.S. Application Data

[62] Division of Ser. No. 459,165, Dec. 29, 1989, Pat. No. 5,057,878.

[51] Int. Cl.$^5$ .......................................... H01L 21/329
[52] U.S. Cl. ...................................... 29/25.02; 437/1; 437/235
[58] Field of Search ................ 437/1, 2, 3, 5, 235; 357/6, 8; 29/25.02

[56] References Cited

U.S. PATENT DOCUMENTS 4,507,672  3/1985  Polember et al. .................. 437/1
4,987,023  1/1991  Sato et al. ....................... 428/215

FOREIGN PATENT DOCUMENTS 0229971 10/1987 Japan ................................ 437/1

OTHER PUBLICATIONS

G. L. Gaines, Jr., *Insoluble Monolayers at Liquid-Gas Interfaces*, Interscience Publishers, New York, N.Y., 1966.
Aviram et al., *Chem. Phys. Lett.* 29, 277 (1974).
M. Martin et al., *J. Appl. Phys.* 54, 2792 (1983).
D. K. Smith et al., *J. Am. Chem. Soc.* 108, 0522 (1986).
A. Aviram et al., *Chem. Phys. Lett.* 146, 490 (1988).
N. J. Geddes et al., *Proc. Third Intl. Symposium on Molecular Electronic Devices*, F. Carter et al., eds., North Holland Publishers, Amsterdam, 1988, p. 495 ff.
R. M. Metzger et al., *Synthetic Metals* 28, C807, at C812-13 (1989).
A. Aviram et al., *Chem. Phys. Lett.* 162, 416 (1989).
N. J. Geddes et al., *Thin Solid Films* 168, 151 (1989).

*Primary Examiner*—Tom Thomas
*Attorney, Agent, or Firm*—Frances P. Craig

[57] ABSTRACT

A method for fabricating a microelectronic device of the metal/insulator/metal' type wherein the insulator is an organic material, and a device fabricated thereby. A first electrically conductive lead is conductively adhered to a first portion of a conductive substrate. A monomolecular layer of highly pure p-dodecyloxyphenylcarbamate of 2-(2'-hydroxyethoxy)-5-bromo-7,7,8,8-tetracyanoquinodimethan is deposited on a surface of a second portion of the conductive substrate not including the first portion to form an organic film. Molecules of the monomolecular layer are generally disposed normal to the substrate surface with their dodecyl terminal moieties adjacent the surface. An essentially oxide-free contiguous layer of magnesium is deposited on the organic film. The deposition if performed at a temperature below about 15° C. A layer of silver is deposited on the magnesium layer to substantially cover and conductively adhere to the magnesium layer. A second electrically conductive lead means is conductively adhered to the silver layer by means of a gallium-indium eutectic alloy. The device exhibits rectifying behavior on application of large voltages. Multilayer devices having an odd number of organic film layers, as well as methods for fabricating such multilayer devices, are also described.

9 Claims, 12 Drawing Sheets

M-I-M' DEVICE AND FABRICATION METHOD

REFERENCE TO RELATED APPLICATIONS

This application is a division of copending U.S. Pat. application Ser. No. 07/459,165 filed Dec. 29, 1989, now U.S. Pat. No. 5,057,878.

BACKGROUND OF THE INVENTION

This invention relates to a microelectronic device of the metal/insulator/metal'(MIM') type, and in particular to such a device wherein the insulator is an organic material.

There has been considerable interest in recent years concerning the possible use of organic and polymeric materials in microelectronic devices where one of the dimensions of the device would be a dimension of a single molecule. Such "molecular electronic devices"(MED) would ultimately have the potential to supersede current microelectronic devices based on silicon or GaAs where the dimensions of elements are typically of the order of one micron (10,000 Å) at present. The dimension of a MED would typically be the length of the specific molecule, about 50 Å. Thin ordered monolayers of such dimension are typically prepared by Langmuir-Blodgett (LB) techniques. Preparation of LB monolayer films are described in the literature. For example, in *Insoluble Monolayers at Liquid-Gas Interfaces* (Interscience Publishers, New York, 1966), incorporated herein by reference, G.L. Gaines, Jr. describes such techniques.

A. Aviram and M.A. Ratner (*Chem. Phys. Lett.* 29, 277 (1974)) advanced a theory concerning the achievement of molecular rectification utilizing organic molecular structures of the D-$\sigma$-A form. Aviram and Ratner theorized that unimolecular oriented films of organic molecules D-$\sigma$-A where D is a strong electron donor (e.g. a tetrathiafulvalene, or TTF, moiety), $\sigma$ is a saturated covalent bridge and A is a strong electron acceptor (e.g. a tetracyanoquinodimethan, or TCNQ, moiety) when sandwiched between two metal films $M_1$ and $M_2$ (or M and M') could be a molecular rectifier.

Since that time there have been many references in the literature to the original evaluations of Aviram and Ratner, with general researchers attempting to synthesize such A-94-D molecules and then to construct rectifying devices from the resulting molecules. Reports of possible rectification in organic films of molecular thickness in scanning tunneling microscope (STM) studies have appeared, and two of these claims have subsequently been retracted (referenced below).

More recently, attention has turned to monolayers of a D-$\sigma$-A type molecule in which D is a substituted phenyl carbamate moiety and A is a substituted tetracyanoquinodimethan (TCNQ) moiety. An aliphatic bridge serves to electronically insulate the donor and acceptor groups on the molecule, and constitutes a barrier to prevent tunneling of electrons between the terminal moieties. Molecules of this type have been synthesized and characterized. However, attempts to fabricate metal/insulator/-metal'(MIM') electronic devices from such molecules have heretofore been unsuccessful. For example, R.M. Metzger et al. reported (Synthetic Metals 28, C807, at C812-13 (1989)) the achievement of rectification in a device utilizing gold as the lower electrode and the bis-(dodecyl)aminophenylcarbamate of 2-bromo-5-hydroxyethoxy-TCNQ as the insulator, and with the nanotip of a modified scanning tunnelling microscope (SCM) acting as the top electrode; but then retracted the claim (R.M. Metzger et al (1989), supra, page C813, Note added in proof). A. Aviram et al. earlier reported (*Chem. Phys. Letters* 146, 490 (1988)) molecular switching and rectification in a similar device utilizing a hemiquinone as the insulating layer, as cited in Metzger et al. ((1989) supra). This claim also has been retracted (A. Aviram et al., *Chem. Phys. Letters* 162, 416 (1989)).

N.J. Geddes et al, in reporting the fabrication of MIM' structures in which the insulator is a fatty acid material applied to the substrate metal layer as a LB film (*Proceedings of the Third International Symposium on Molecular Electronic Devices*, F. Carter et al., eds., North Holland Publishers, Amsterdam, 1988, p. 495 ff) have described techniques that avoid damage to the fatty acid layer during deposition of a top electrode layer in a MIM' device. These techniques have facilitated the investigation of the electrical properties of a LB bilayer of such fatty acid materials (Geddes et al., *Thin Solid Films* 168, 151 (1989)).

Rectification has also been reported in the literature with reference to thin films of other organic and polymeric materials. However, the devices differ markedly from the MIM' devices described hereinbelow. For example, when an organic layer 20,000 Å thick of zinc phthalocyanine (PcZn) utilized in a gold-PcZn-metal' device was exposed to air, a strong rectifying effect was noted (M. Martin et al., *J. Appl. Phys.* 54, 2792 (1983)).

The term "rectification" has been used by D.K. Smith et al. (*J. Am. Chem. Soc.* 108, 0522 (1986)) to describe a different mechanism, an electrically irreversible process in a redox polymer bound to an electrode in samples described as approximating a monolayer in thickness. As used herein, however, the term "rectification" is used to describe the converting of an alternating electrical current to a unidirectional current. The organic film, in this process, is a medium for electron transfer, in a single direction only, from one electrode to the other.

This application describes the synthesis of the p-dodecyloxyphenylcarbamate of 2-(2'-hydroxyethoxy)-5-bromo-7,7,8,8-tetracyanoquinodimethan (DDOP-C-BHTCNQ) as a molecular compound sufficiently pure to effectively act as the insulating layer in an MIM' device. It also describes the fabrication of a MIM' device in which the metal of the top layer differs from that of the substrate layer, utilizing either a single LB monolayer or an odd number of LB monolayers of this compound. The exemplary devices according to the invention described herein exhibit sufficient current-voltage (I/V) asymmetry to serve as a rectifying device. Such devices are useful as, for example, rectifiers, memory devices, switches, diodes, or transistors, and are activated by appropriate controls such as electric fields, light beams, heat, and the like.

SUMMARY OF THE INVENTION

In a first aspect, the invention is a method for fabricating a microelectronic device of the metal/insulator/metal' type wherein the insulator is an organic material. The method involves depositing on a surface of a conductive substrate a monomolecular layer of highly pure p-dodecyloxyphenylcarbamate of 2-(2'-hydroxy-ethoxy)-5-bromo-7,7,8,8-tetracyanoquinodimethan to form an organic film on the surface. Molecules of the monomolecular layer are generally disposed normal to the surface with their dodecyl terminal moieties adjacent the surface. An essentially oxide-free contiguous layer of magnesium is then deposited by vacuum evaporation onto the organic film while the substrate and the organic film are maintained at a temperature below about 15° C. A layer of silver is then deposited on the magnesium layer to substantially cover and conductively adhere to the magnesium layer. First electrically conductive lead means is then conductively adhered to the silver layer by means of a gallium-indium eutectic alloy.

In a second aspect, the invention is a method for fabricating a microelectronic device of the metal/insulator/metal' type where the insulator is an organic material. The method involves depositing on a surface of a first portion of a conductive substrate n monomolecular layers, where n is an odd integer greater than 1, of molecules of highly pure p-dodecyloxyphenyl-carbamate of 2-(2'-hydroxyethoxy)-5-bromo-7,7,8,8-tetracyanoquinodimethan to form an organic film on the surface. Molecules of a first of the monomolecular layers are generally disposed normal to the first portion surface with their dodecyl terminal moieties adjacent the surface and their tetracyanoquinodimethan terminal moieties distal from the first portion surface. Molecules of a second to an n-1 of the monomolecular layers are generally disposed normal to one of the monomolecular layers immediately therebelow with their terminal moieties adjacent like moieties of two of the monomolecular layers immediately adjacent thereto. Molecules of an n of the monomolecular layers are generally disposed normal to the n-1 monomolecular layer immediately therebelow with their dodecyl terminal moieties adjacent like moieties of the n-1 monomolecular layer. An essentially oxide-free contiguous layer of magnesium is then deposited by vacuum evaporation onto the organic film while the substrate and the organic film are maintained at a temperature below about 15° C. A layer of silver is then deposited on the magnesium layer to substantially cover and conductively adhere to the magnesium layer. First electrically conductive lead means is then conductively adhered to the silver layer by means of a gallium-indium eutectic alloy. In a third, narrow aspect, n is an odd integer of 3-21 inclusively.

BRIEF DESCRIPTION OF THE DRAWINGS

For a better understanding of the present invention, together with other objects, advantages and capabilities thereof, reference is made to the following Description and appended Claims, together with the Drawings, in which:

DETAILED DESCRIPTION OF THE PREFERRED EMBODIMENTS

Figure 1:
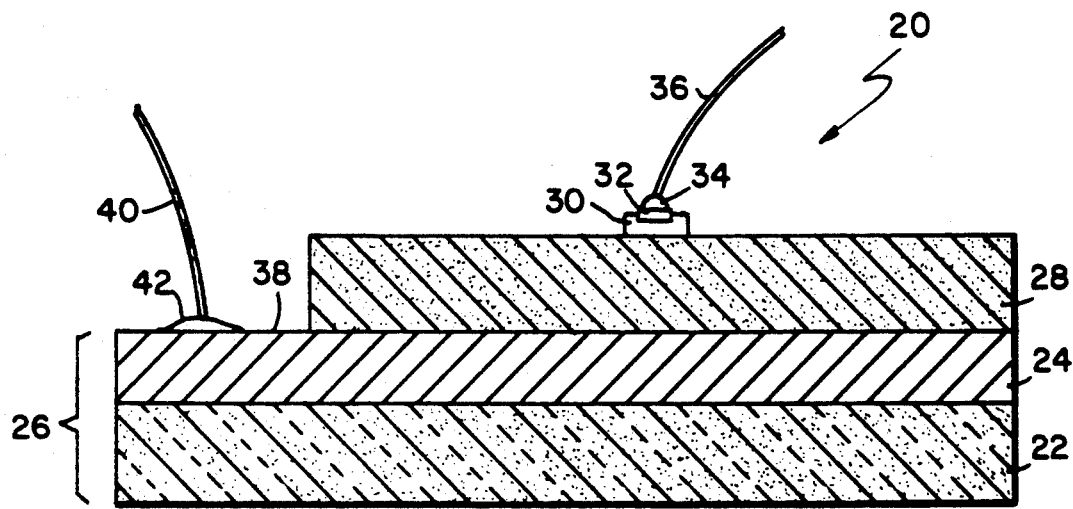
FIG. 1 is an elevation view showing a schematic representation of a typical device according to the invention.

A typical device according to the invention is represented schematically in FIG. 1, illustrating MIM' device 20 in which glass slide 22 supports lower electrode 24 to form conductive substrate 26. Organic film 28 is deposited on substrate 26. Magnesium disk 30 contacts organic film 28, forming an electrical junction. Silver overlayer 32 substantially covers the magnesium, and gallium-indium droplet 34 rests on the silver overlayer. Gold wire 36 connects the upper electrode to the remainder of an electrical circuit (not shown). The configuration of an array of such M-LB-M' junctions are shown in FIG. 2, in which like features to those of FIG. 1 are indicated by the same reference numerals.

FIG. 1 also illustrates an embodiment of an electrical connection of the outside circuit to lower electrode 24 of substrate 26. Organic layer 28 covers lower electrode 24 over all of its surface except at land 38. Gold wire 40 is adhered to lower electrode 24 at land 38 by contact 42, which may be any suitable contact material.

Figure 2:
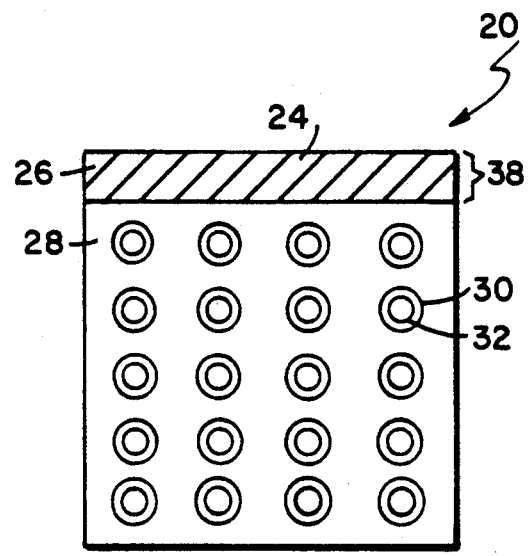
FIG. 2 is a plan view showing a schematic representation of the configuration of an array of the type of M-(Langmuir-Blodgett film )-M' junctions shown in FIG. 1.

The device of FIGS. 1 and 2 is fabricated by an illustrative process in which one or more monomolecular layers of p-dodecyloxyphenylcarbamate of 2-(2'-hydroxyethoxy)-5-bromo-7,7,8,8-tetracyanoquinodimethan (DDOP-C-BHTCNQ) is deposited on a surface of a conductive substrate to form an organic film. Synthesis of a sufficiently pure DDOP-C-BHTCNQ compound is described below. The deposition is preferably by Langmuir-Blodgett techniques. Molecules of the monomolecular layer are generally parallel to one another and normal to the substrate surface. An odd number of monomolecular layers is deposited on the conductive substrate, either a single layer one molecule deep or a multilayer coating of an odd number of monomolecular layers superimposed on one another in a head-to-head and tail-to-tail molecular array, as illustrated schematically in FIG. 3. A single monolayer is shown in device 50a of FIG. 3a, with the dodecyl terminal moieties of the molecules of the single monomolecular organic layer 54a adjacent lower electrode 52. A triple organic layer 54c of three superimposed monolayers is shown in device 50c of FIG. 3c, in which the dodecyl terminal moieties, of the molecules of first-deposited monomolecular layer 58a are adjacent lower electrode 52, the TCNQ terminal moieties of second-deposited monomolecular layer 60c are adjacent the like TCNQ terminal moieties of first-deposited layer 58a, and the dodecyl terminal moieties of the molecules of third-deposited monomolecular layer 62 are adjacent the like dodecyl terminal moieties of second-deposited layer 60c. Thus, in both the single and triple organic layers, and in other organic layers of an odd number of similarly superimposed monolayers, the terminal moieties exposed for contact by the top electrode 56 are TCNQ moieties. In contrast, in bilayer device 56b illustrated in FIG. 3b, which is not according to the invention, two superimposed monomolecular layers are deposited similarly forming organic layer 54b, leaving the dodecyl terminal moieties exposed for contact by top electrode 56. Similarly, devices with a greater, also even number of monomolecular layers, deposited headto-head and tail-to-tail, the dodecyl terminal moieties are exposed for contact by the top electrode. This arrangement will not produce a rectifying device, as shown in the Examples.

The deposition surface of the conductive substrate is preferably hydrophobic, to ensure that the dodecyl terminal moieties of the lowermost layer of the film are adjacent the substrate surface. The preferred conductive substrate materials are platinum, silver, gold, and indium tin oxide, as films deposited, e.g., on glass supporting substrates. Platinum is the most preferred substrate material. As used herein and in the appended claims, the term "metal" is intended to include indium tin oxide and similar materials which act in a similar manner to metallic conductive films. Indium tin oxide is also commercially available as a coated glass (ITO glass).

An oxide-free contiguous layer of magnesium is deposited by vacuum evaporation onto the organic film while the substrate and the organic film are cooled to about 15° C. or lower, preferably about 10° C. A layer of silver is deposited on the magnesium layer to protect the magnesium layer.

An electrically conductive contact to the silver layer is established by means of a gold wire attached to the silver layer by a gallium-indium eutectic alloy. A second contact is attached to the conductive substrate in such a way that the second contact does not conductively contact the organic film.

The following Examples are presented to enable those skilled in the art to more clearly understand and practice the present invention. These Examples should not be considered as a limitation upon the scope of the present invention, but merely as being illustrative and representative thereof.

EXAMPLES

Synthesis and Characterization of 2-(2-Hydroxyethoxy)-Bromo-7,7,8,8-Tetracyanoquinodimethan The precursor compound 2-(2'-hydroxyethoxy)-bromo-7,7,8,8-tetracyanoquinodimethan (BHTCNQ) was synthesized by known means, as described by W.R. Hertler (*J. Org. Chem.* 41. 1412 (1976), incorporated herein by reference). The acetonitrile solution electronic spectral data for this compound are summarized in Table I, §1. The characteristics of the synthesized material were in good agreement with those reported in the literature. Single crystals of the compound were grown by slow crystallization from an acetonitrile solution. Precession and Weissenburg photographs of the resulting red needle form crystals yielded the following data for the monoclinic crystal: $a = 13.75$ Å, $b = 10.80$ Å, $c = 9.26$ Å, $\beta = 97°45'$, $V = 1374$ Å$^3$, $\rho_{calc} = 1.66$ g/cm$^3$, $\rho_{obs} = 1.64 \pm 0.01$ g/cm$^3$, indicating that the product was the desired BHTCNQ. These values may be compared to those reported by R.K. Laidlaw et al. (*Acta Cryst. B44*, 645 (1988)).

Synthesis of p-Dodecyloxphenylisocyanate

The precursor compound p-dodecyloxyphenylisocyanate was then synthesized as follows. Thionyl chloride, in an amount of 10.94 ml (17.85 g, 0.15 mole) was added to 12.24 g (0.04 mole) p-dodecyloxybenzoic acid, and the mixture stirred for 1 hr at room temperature. Excess thionyl chloride was distilled, 15 ml toluene was added to the mixture, and the distillation continued until the boiling point of toluene (110.6° C.) was reached. The resulting acid chloride mixture was cooled to room temperature, and 14.64 g (0.225 mole) sodium azide in a water-acetone solution was added to an acetone solution of the acid chloride. The mixture was stirred for 1 hr and was extracted with chloroform. The organic layer was separated out, dried over MgSO$_4$, filtered, and evaporated to remove the chloroform. The residue was dissolved in toluene and refluxed for 16 hr. The toluene was evaporated and the residue distilled at 150°−1 62° C. and 9 mTorr producing a viscous liquid which solidified on cooling in an ice bath, yielding 6.78 g (56% yield) of p-dodecyloxyphenylisocyanate. The mass spectrum exhibited the molecular ion at m/e 303. The infrared spectrum exhibited the following string absorptions: 2920, 2860, 2270, 1570, 1520, 1460, 1390, 1285, 1240, 1170, 1105, 1040, 825, 795, 715, and 635 cm$^1$.

Preparation of the p-Dodecyloxvphenylurethane of 2-(2-Hydroxyethoxy)-5-Bromo-7,7,8,8-Tetracyanoquinodimethan A mixture of 0.220 g (0.73 mmole) of the p-dodecyloxyphenylisocyanate and 0.257 g (0.75 mmole) of the BHTCNQ compound was heated at reflux for 5 hr in a 10 ml acetonitrile solution containing a catalytic amount of dibutyltindilaurate. The mixture was cooled and the product crystallized from acetonitrile to give 190 mg (40% yield) of the p-dodecyloxyphenylurethane of 2-(2'-hydroxyethoxy)-5-bromo-7,7,8,8-tetracyanoquinodimethan (DDOP-C-BHTCNQ). The melting point of the product was 152°-154° C., softening at 144° C. Analysis: Calculated for $C_{33}H_{36}BrN_5O_4$: C, 61.30 H, 5.61; N, 10.83. Found: C, 61.54; H, 5.46; N, 10.78. The acetonitrile electronic spectrum of this material is summarized in Table I, §2, and was not in accord with the previous report by R. M. Metzger et al. (*J. Molecular Electronics* 2, 119 (1986)).

TABLE I

| Invention | | | Prior art* | | |
|---|---|---|---|---|---|
| $\lambda_{max}$-nm | $\epsilon$ | $\log_{10} \epsilon$ | $\lambda_{max}$-nm | $\epsilon$ | $\log_{10} \epsilon$ |
| 1. Precursor BHTCNQ: | | | | | |
| 481 | 4700 | 3.672 | 485 | 4461 | |
| 412 | 42860 | 4.64 | 413 | 41521 | |
| 396 sh | 42220 | 4.626 | 390 sh | 39805 | |
| 280 | 3230 | 3.509 | 280 | 3157 | |
| 2. DDOP-C-BHTCNQ: | | | | | |
| 475 | 4150 | 3.617 | 475 | 775 | 289 |
| 410 | 37750 | 4.578 | 410 | 4360 | 3.64 |
| 396 sh | 35200 | 4.546 | 282 | 815 | 2.91 |
| 282 | 4460 | 3.650 | 239 | 2460 | 3.39 |
| 238 | 20540 | 4.312 | | | |

*BHTCNQ prior art data from Hertler, supra; DDOP-C-BHTCNQ prior art data from Metzger et al. (1989), supra.

Preparation of the Langmuir-Blodgett Monolayer

For each device prepared, a solution of DDOP-C-BHTCNQ was formed for dispensing onto the surface of a Langmuir trough by dissolving the material in chloroform prior to usage. Typically 5mg of the material was placed in a cleaned glass vial to which was added approximately 5 ml of the chloroform (AnalaR grade). The DDOP-C-BHTCNQ material was then ultrasonically agitated in the chloroform for about 15 minutes to ensure complete dissolving.

Once the DDOP-C-BHTCNQ solution had been formed, an isotherm was produced. The LB trough, of a moving barrier PTFE type, was cleaned and filled with a subphase of Elga water which had a resistivity of 18–20 MΩcm at temperatures of 17–20° C. The pH was that of the "pure" water as produced by the Elga system, 5.5–6.5. No buffer solutions were added, to avoid any possible contamination of the LB monolayer. Before dispensing the LB material the surface of the subphase was swept repeatedly with a cleaned barrier until no change in the surface pressure was observed, to ensure that any surface contamination was removed.

Figure 4:
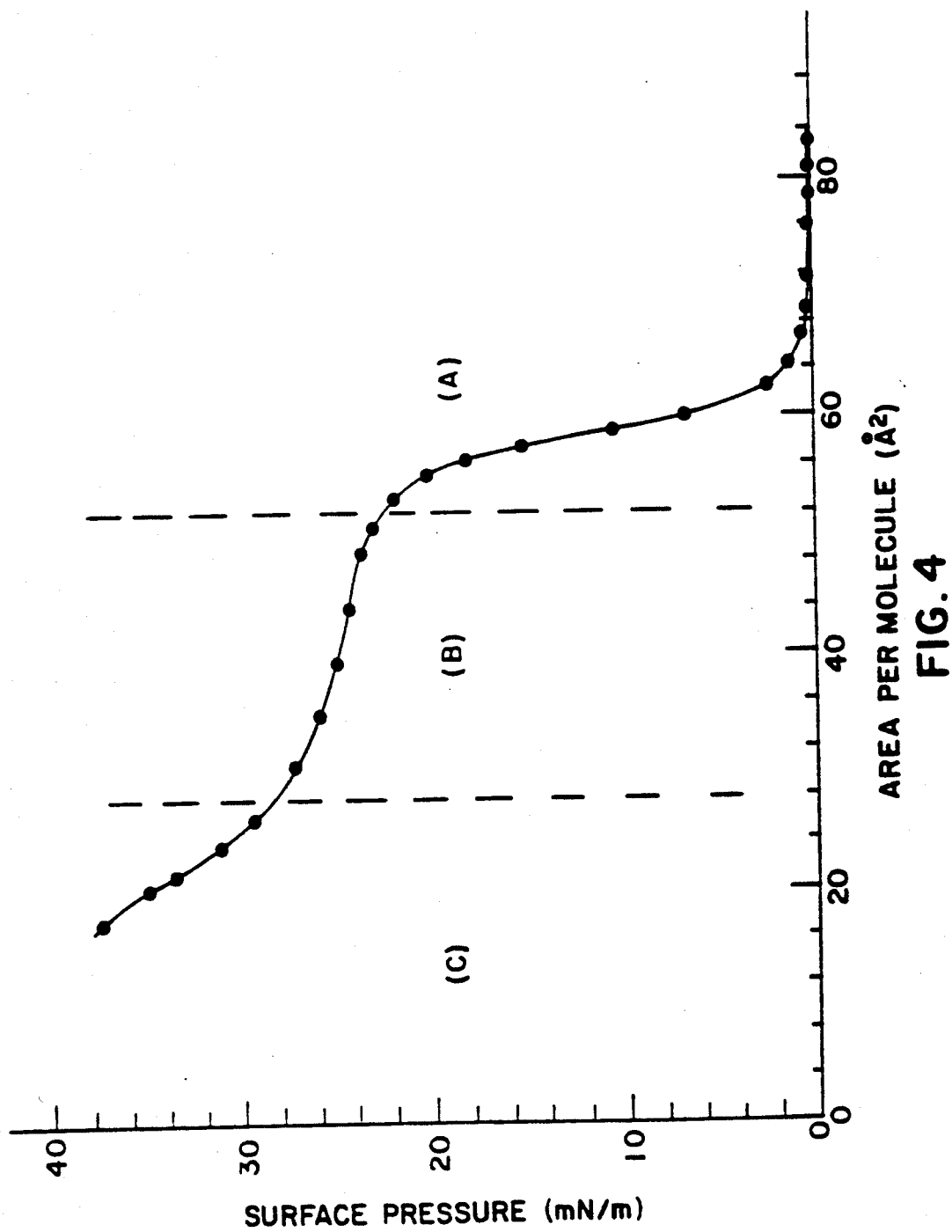
FIG. 4 is a graphical representation of an isotherm plot showing the variation of the surface pressure in a compressed monomolecular film in a Langmuir-Blodgett (LB) trough with the area occupied by each molecule of the film.

In dispensing of the DDOP-C-BHTCNQ solution onto the surface of the subphase, droplets were released from heights of approximately 1 cm or less to avoid contaminating the subphase. The amount of material dispensed was limited to 100 μof a $5 \times 10^{-6}$ molar solution, to avoid coalescing of the LB material. Typically for LB systems, the solution formed a monolayer, or monomolecular layer, of the DDOP-C-BHTCNQ on the surface of the water in the LB trough. The solution surface layer was then compressed at a speed of 0.5 cm$^2$/s with the surface pressure and area of the subphase monitored as a function of time. An isotherm of the DDOP-C-BHTCNQ monolayer in the LB trough is shown in FIG. 4, in which three regions are marked. The optimum surface pressure for depositing the DDOP-C-BHTCNQ layers was determined by studying the stability of a compressed monolayer in each of these regions. The surface pressure found to be most stable was 20 mN/m, which was chosen for depositing the DDOP-C-BHTCNQ monolayers described herein. From FIG. 4 this is seen to occur at the top of the first "knee" in the isotherm.

EXAMPLES 1–2

Fabrication of the MIM Structures

The supporting substrates upon which the junctions were fabricated were flame polished glass cover slips, chosen for their high quality of surface finish, which had been metallized with the lower electrode metal.

After cutting to the correct dimensions and before metallizing, the glass cover slips were prepared by placing them in a solution of concentrated, fuming nitric acid for about 2 hours. On removal they were rinsed in deionized water, placed in a liquid reflux of propan-2-ol, then refluxed in 1,1,1-trichloroethane. The cover slips were then placed in a vapor of hexamethyldisilazane which left their surfaces hydrophobic. For the monolayer device, an oxide-free platinum electrode about 1000 Å thick was deposited by vacuum evaporation onto the whole of one face of a glass slide. Due to the very high temperature of evaporation of the platinum, about 2000° C., the deposition was conducted in an electron beam evaporator. The starting pressure was $<10^{-6}$ torr which increased to about $5 \times 10^{-6}$ during deposition. Due to the heat involved in such an evaporation the deposition of the required thickness of film was performed in two steps, maintaining the vacuum between steps and during the cooling of the substrate. For the bilayer device, an oxide-free 1000 Å layer of 99.99% pure silver from a molybdenum boat was deposited on a glass slide in a thermal evaporation system, at a pressure of $2 \times 10^{-6}$ Torr and at a rate of 30 Å/s. The resulting substrate structures were similar to those illustrated as substrate 26 in FIG. 1.

The DDOP-C-BHTCNQ monolayer was then deposited from the water surface onto the platinum and silver substrates in known manner. The transfer speed onto the substrate was about 0.1–0.2 mm/s. This speed was found to give "dry" substrates on withdrawal from the subphase and a smooth continuous movement of the meniscus during deposition.

Platinum, a metal with a nearly oxide free surface, was used as the substrate for the deposition of a single monolayer. The platinum was found to be hydrophobic in nature, appearing dry when withdrawn from a water bath, possibly due to a very thin oxide layer on the surface. The substrate was started in the water in the trough and withdrawn once the subphase monolayer was compressed to the required pressure.

The silver substrate was used for the deposition of the LB bilayer. The substrates in this case started out of the water, crossing the air/water interface once the subphase monolayer had been compressed to the required pressure.

Figure 3A:
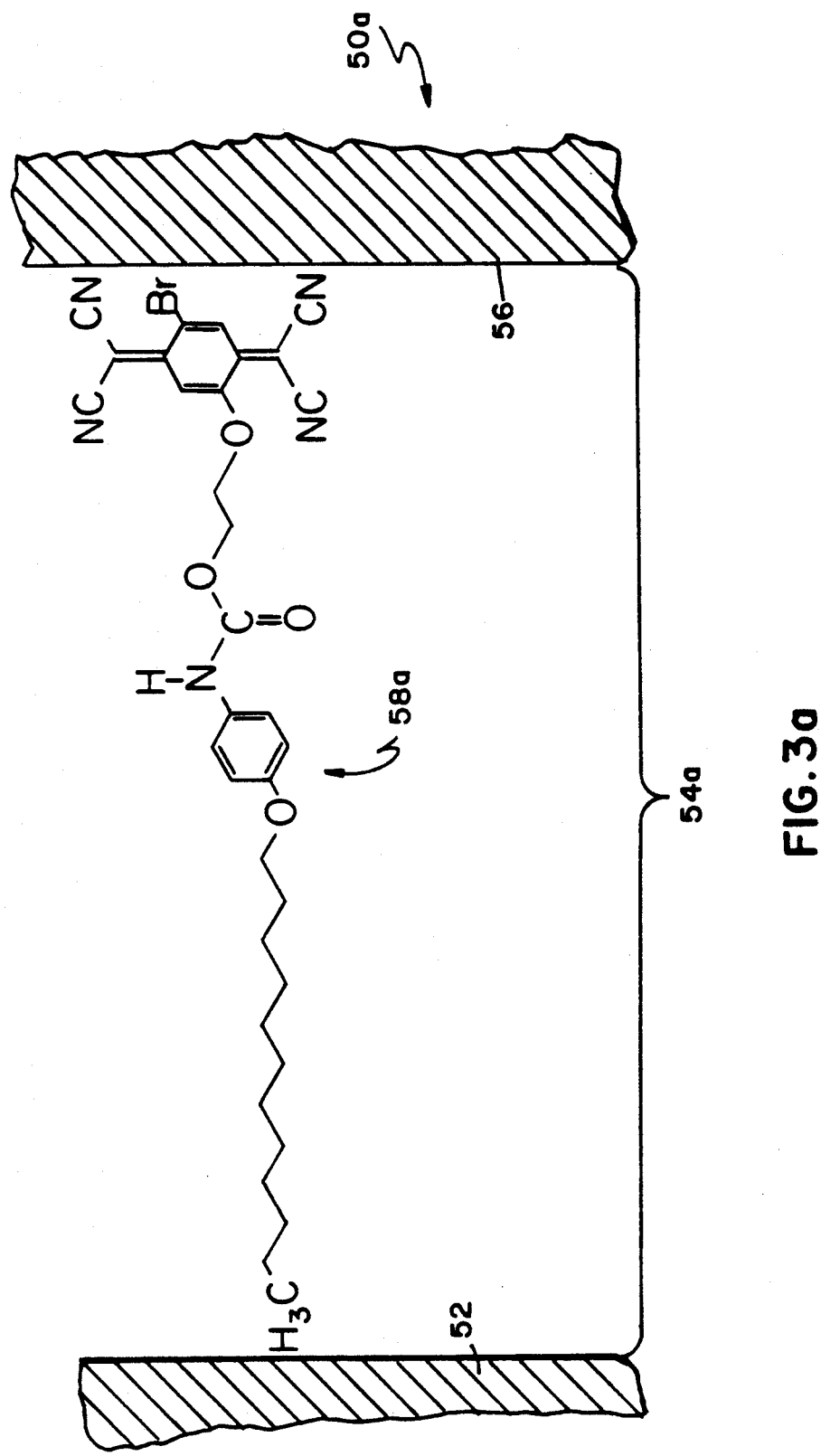
FIGS. 3a-3b illustrate schematically the orientation of single and triple monomolecular layers, respectively, according to differenct aspects of the invention.
Figure 3B:
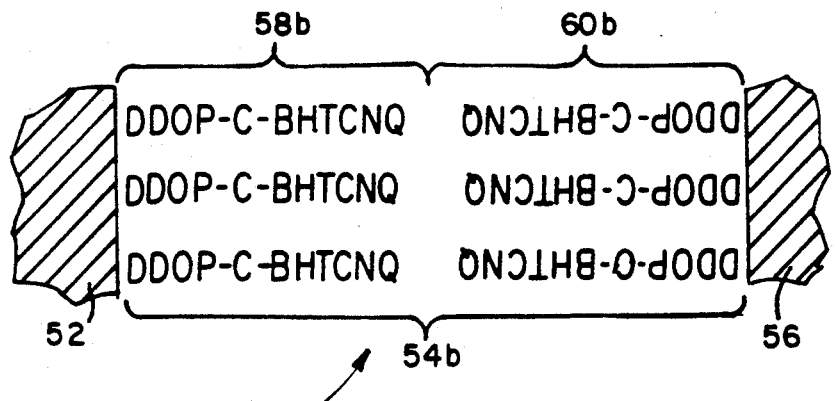

The DDOP-C-BHTCNQ layers were deposited under the transfer conditions mentioned above, i.e. a surface pressure of about 20 mN/m and a speed of about 0.1–0.2 mm/s. The monolayer on the surface of the LB subphase was compressed at 0.5 cm$^2$/s until the surface pressure reached the top of the first "knee" of the DDOP-C-BHTCNQ isotherm shown in FIG. 4. The monolayer on the surface of the LB trough was held at constant pressure throughout the deposition of the required number of monomolecular layers onto the substrate. The sample was stored under desiccated conditions for a minimum of one week prior to the next step to aid in the removal of trapped water from the LB film. Typically for LB films, each layer was deposited with the molecules normal to the substrate surface. The monolayer was about 22 Å thick, the length of a single molecule, and was deposited with the dodecyl terminal moieties adjacent the metallized surface of the substrate, as shown in FIG. 3a, and the TCNQ moieties exposed. The bilayer was deposited with the dodecyl terminal moieties of the first layer adjacent the metallized surface and the TCNQ terminal moieties of the second layer adjacent the like, TCNQ terminal moieties of the first layer. Thus the dodecyl moieties of the second layer were uppermost in the organic layer, and were exposed. Both of the resulting glass-electrode-organic structures were similar to that illustrated at reference numerals 22–28 in FIG. 1.

On removal from the desiccator, multiple circular counter electrodes, each a magnesium film, were deposited over the DDOP-C-BHTCNQ layers, using a mask to control the deposition area. The evaporation chamber was pumped to a pressure of $1 \times 10^{-6}$ torr, then a Meissner trap was used to remove as much of the remaining water vapor as possible. This reduced the pressure to about $3 \times 10^{-7}$ torr which was found to result in the best quality magnesium films. The magnesium was evaporated from a tungsten filament and deposited at a rate of about 2 Å/s onto the substrate, which was cooled to approximately 10° C. to aid adhesion of the magnesium. The magnesium thickness was approximately 1000 Å, sufficient to form a continuous electrode for good electrical contact. Each magnesium electrode was a disk about 1 mm diameter on the much larger base electrode about 625 mm$^2$. Care was taken not to permit contact of the lower electrode layer by the magnesium contacts, and to preserve the as-deposited characteristics of the organic film. To ensure repeatable, high quality deposition of the magnesium, the mask through which the magnesium was deposited was coated with a very thick layer of magnesium. This was done to avoid re-evaporation of magnesium from the LB surface during deposition and to prevent coating of the mask rather than the sample. To ensure production of high quality metallic films grounding contacts were made during the magnesium deposition to each of the four corners of the lower electrode deposited on the glass slide.

Finally, to prevent deterioration due to aging of the magnesium films, a further silver layer was then deposited, using a mask, to substantially cover each magnesium disc. To avoid heat damage to the LB material, an approximately 60 Å thick silver film was deposited onto the magnesium very slowly, about 10 Å at a time with about 10 minutes between successive depositions. This rate of deposition produced no measurable damage to the organic material, and inhibited oxidation of the magnesium sufficiently to allow the subsequent measurement of electrical characteristics of the device over several days. Each silver overlayer had a smaller diameter (about 0.5 mm) than the magnesium electrode to substantially cover the magnesium layer while avoiding direct contact with the organic film. Electrical contact was made to this top electrode via a gallium-indium droplet which was carefully placed onto the silver overlayer, and by a thin gold wire lowered into the droplet. The resulting structure was similar to that illustrated at reference numerals 22-36 in FIGS. 1 and 2. In Examples 1 and 2, contact 42 was provided by a gallium-indium alloy.

Electrical Characterization of the Device

Each as-prepared sample was placed inside a metal box (not shown), to shield it from electrical noise, and its electrical characteristics were measured. For room temperature direct current (dc) measurements a sweep voltage, which generated signals from $\pm 1$ mV to $\pm 10$ V over time scales of seconds to hours, was applied to each as-prepared device in an ambient atmosphere, and the current measured. The measurement of the current to voltage (I/V) relationship allowed the evaluation of both capacitance and conductance of the junction.

Figure 5:
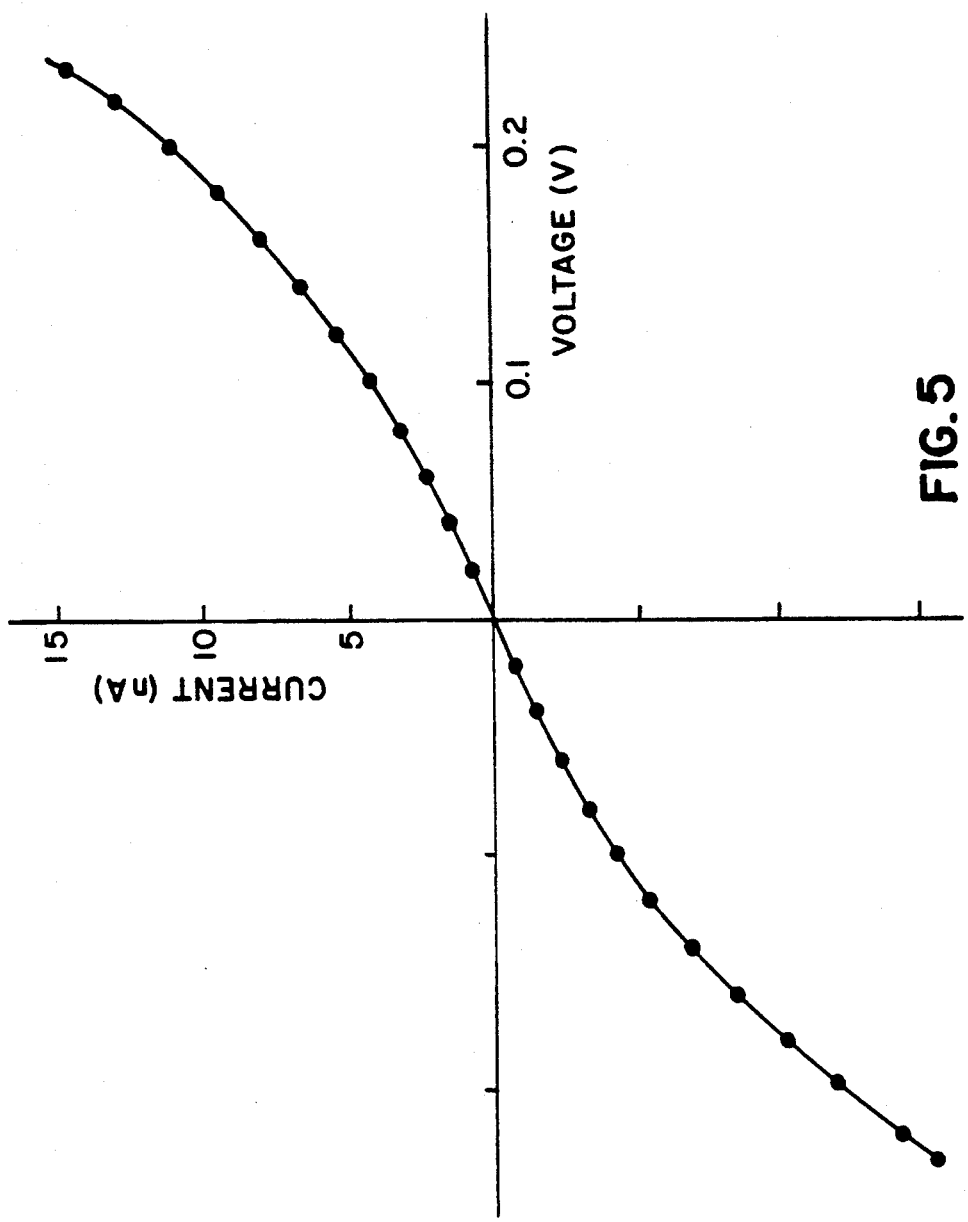
FIGS. 5-15 are graphical representations of various electrical characteristics of actual monolayer and multilayer devices according to various aspects of the invention, and comparative electrical characteristics of actual bilayer devices not according to the invention.
Figure 6:
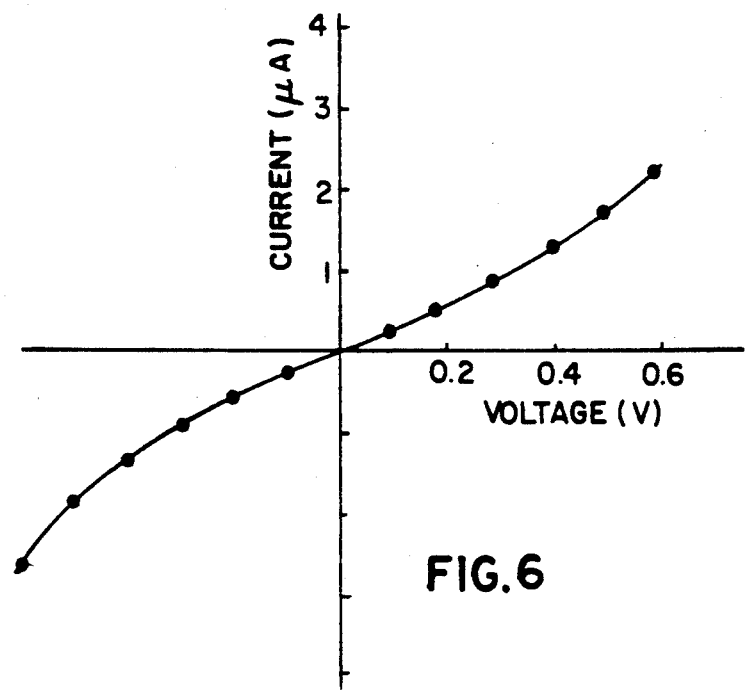
Figure 7:
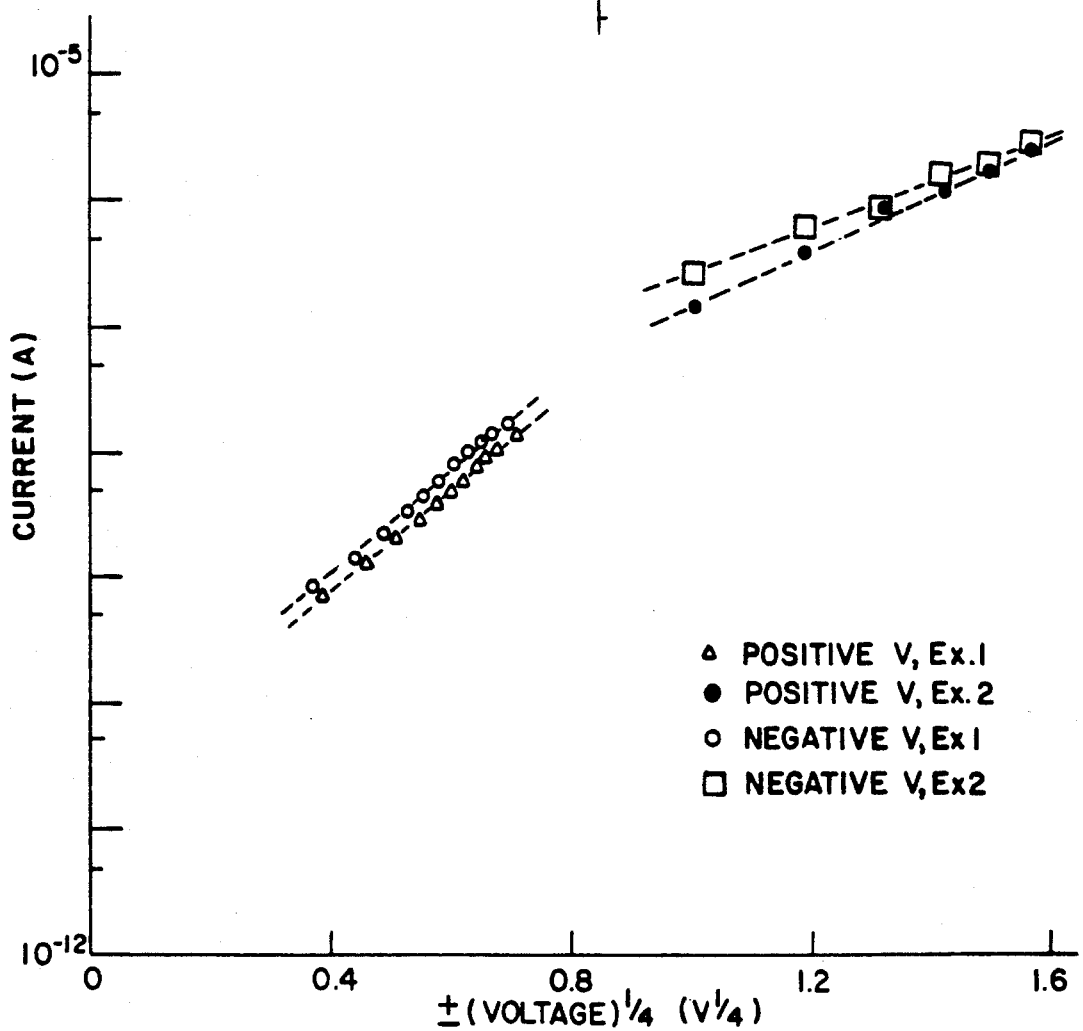
Figure 8:
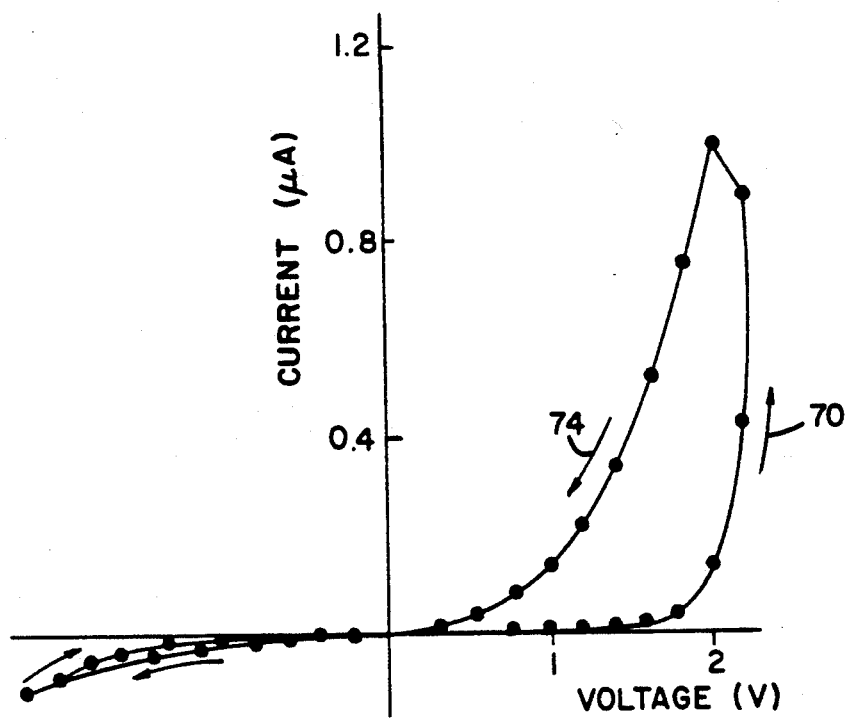
Figure 9:
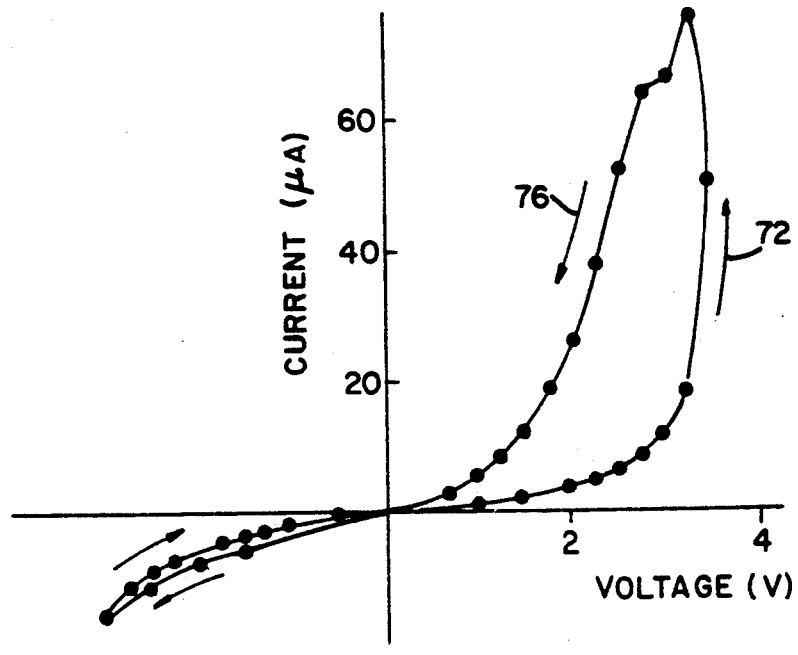
Figure 10:
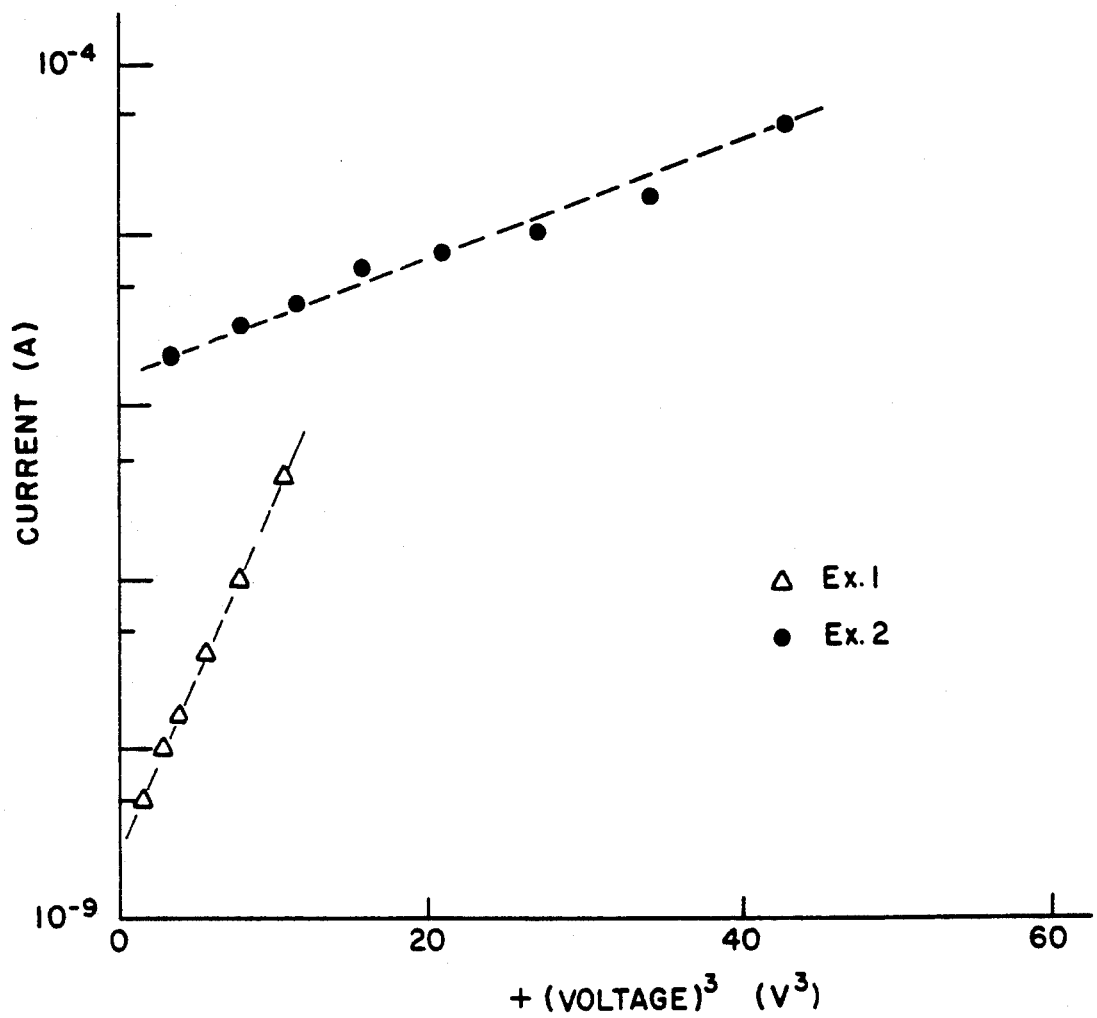

Two regions were considered for low bias results. Below an applied voltage of about $\pm 20$ mV the I/V relationships were linear and symmetric. For slightly higher applied voltages the I/V relationships were non-linear but still symmetric up to about $\pm 1.5$ V as shown in FIGS. 5-6. The best fit to these curves is $\ln(I) = V^{\frac{1}{4}}$, as shown in FIG. 7. This behavior is known in M/LB/M' structures, generally being attributed to some form of tunneling through the organic layer where the insulating barrier has been reduced by imaging forces. Very unusual behavior was observed in the as-prepared devices in the so called high bias region, i.e. at applied voltages greater than about $V > +2$ V. The devices were tested between about $-7$ V and $+4$ V. It was surprising that the structures could sustain such a high voltage across the junction, being a field of the order of $10^8$ V/m. The highly asymmetric I/V relationship at these high voltages for both the as-prepared monolayer device and the as-prepared bilayer device is shown in FIGS. 8-9, showing a large increase in the passage of current for positive voltages above a certain level (positive voltage is determined relative to the base electrode). As the positive voltage was increased, the current suddenly increased, along arrow 70 for the monolayer device and along arrow 72 for the bilayer device, and then fell, along arrow 74 for the monolayer device and along arrow 76 for the bilayer device, indicating a hysteresis. Table II shows the averaged values for this "switch-on" voltage in these as-prepared devices. The best fit to this positive voltage data is $\ln(I) = V^3$ dependence, as shown in FIG. 10.

TABLE II

| Example | 1 | 2 |
|---|---|---|
| Substrate | Pt | Ag |
| No. LB Layers | 1 | 2 |
| Condition | As-prepared | As-prepared |
| Low Bias Conductance (G), $\Omega^{-1}$ | $(4.0 \pm 2.0) \times 10^{-8}$ | $(2.0 \pm 1.0) \times 10^{-6}$ |
| High Bias Switch-On Voltage, V | $2.0 \pm 0.05$ | $3.0 \pm 0.06$ |

Figure 11:
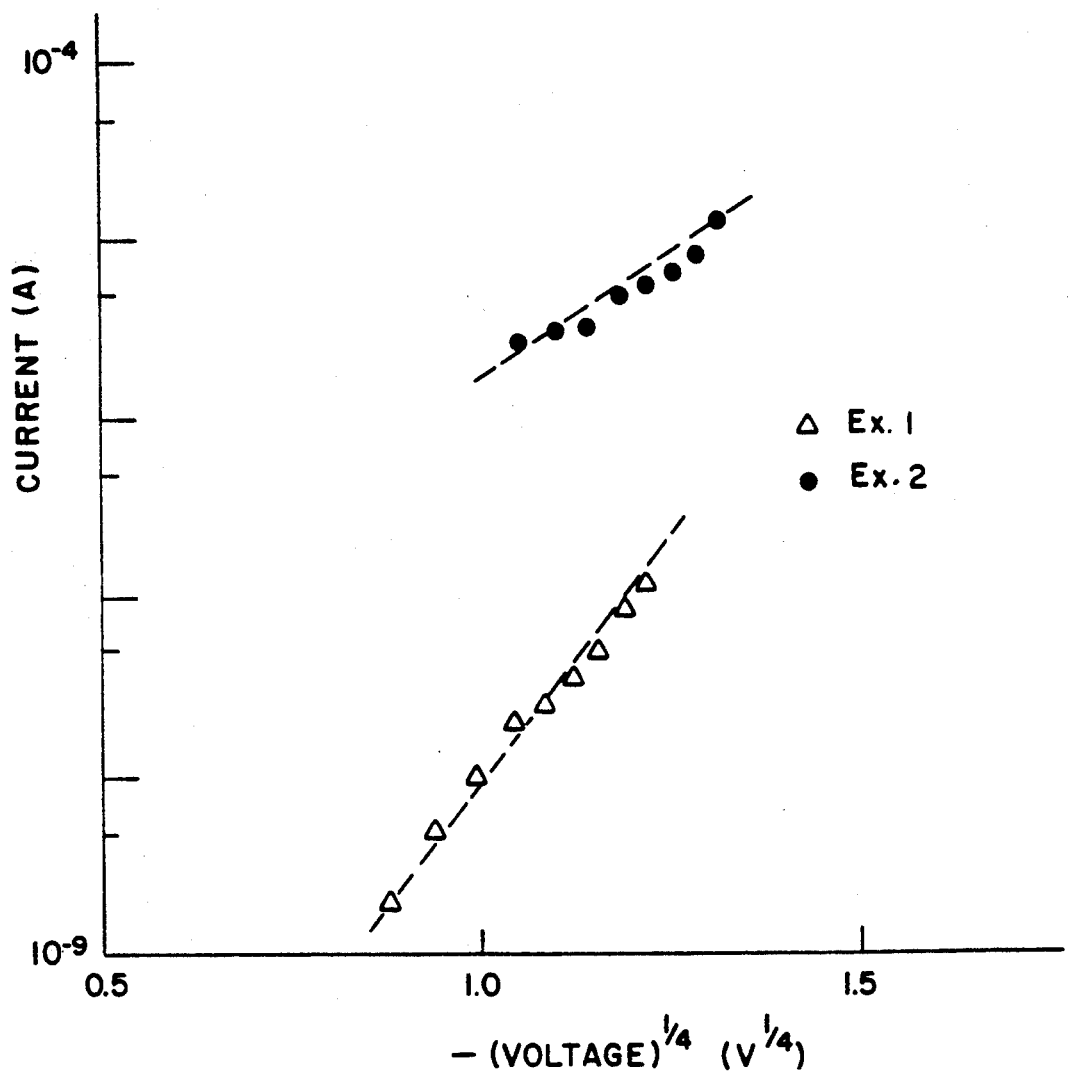

FIG. 11 shows that this behavior was not observed for large negative voltages. At large negative voltages, the I/V curves for the as-prepared devices retained the $\ln(I) = V^{\frac{1}{4}}$ dependence observed at lower voltages, indicating similar minimal tunneling behavior at these negative voltages.

Figure 12:
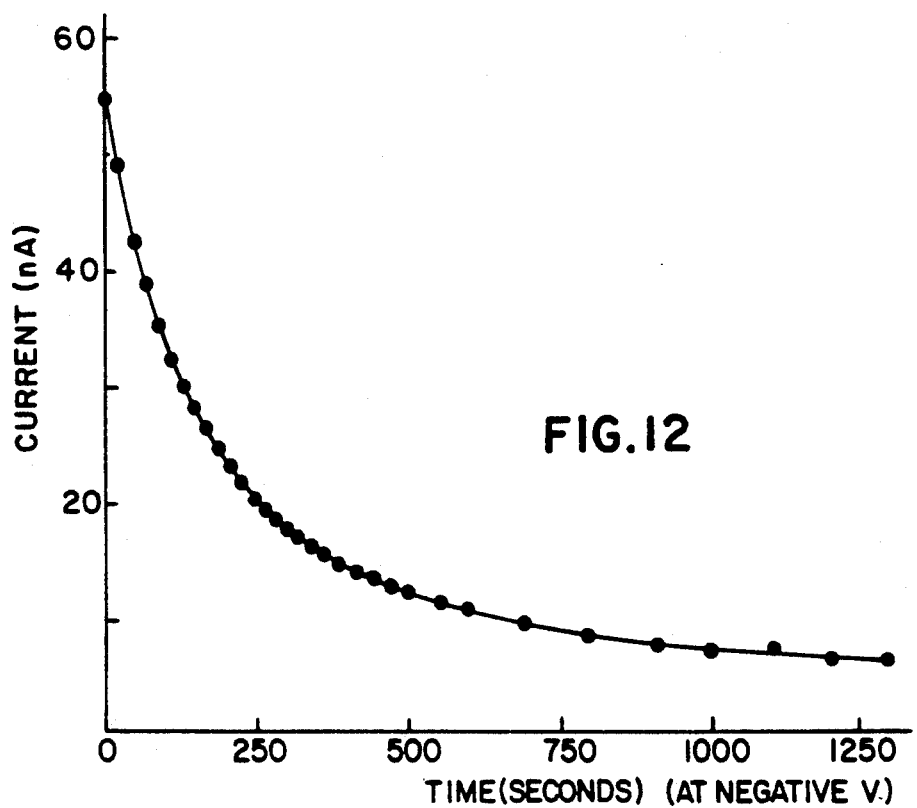
Figure 13:
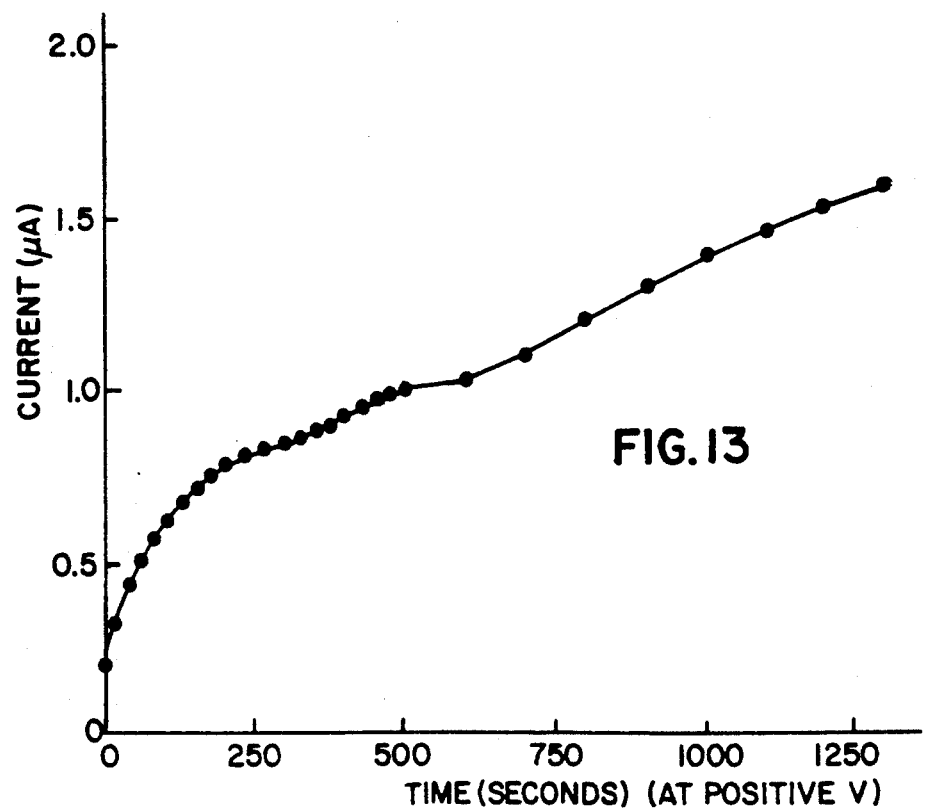

Utilizing the as-prepared monolayer device, changes in the current over time at constant positive and negative high bias voltages were monitored at about $\pm 2$ V. The behavior of the current/time relationship was found to be completely different for the positive and the negative voltages in this device. At negative voltages, which do not have a high current region, a decay of current with time was observed, as shown in FIG. 12. This may be compared to the significant increase with time observed for the same device held at the same magnitude positive voltage, as shown in FIG. 13. It can also be seen that the current was about two orders of magnitude higher for the positive voltage. Clearly the asymmetry of the current behavior shown in these results for the single monolayer device ties in with the asymmetry in its I/V characteristics. However, the degree of this asymmetry increased with time as the device was held at high voltage for an extended period, indicating changes in the character of the device, most likely a rearrangement of the molecular array in the organic layer.

Annealing

In light of the time dependent behavior observed for the monolayer device at constant high voltages, both the monolayer and bilayer devices were annealed at a constant temperature of 70° C. for several hours.

Figure 14A:
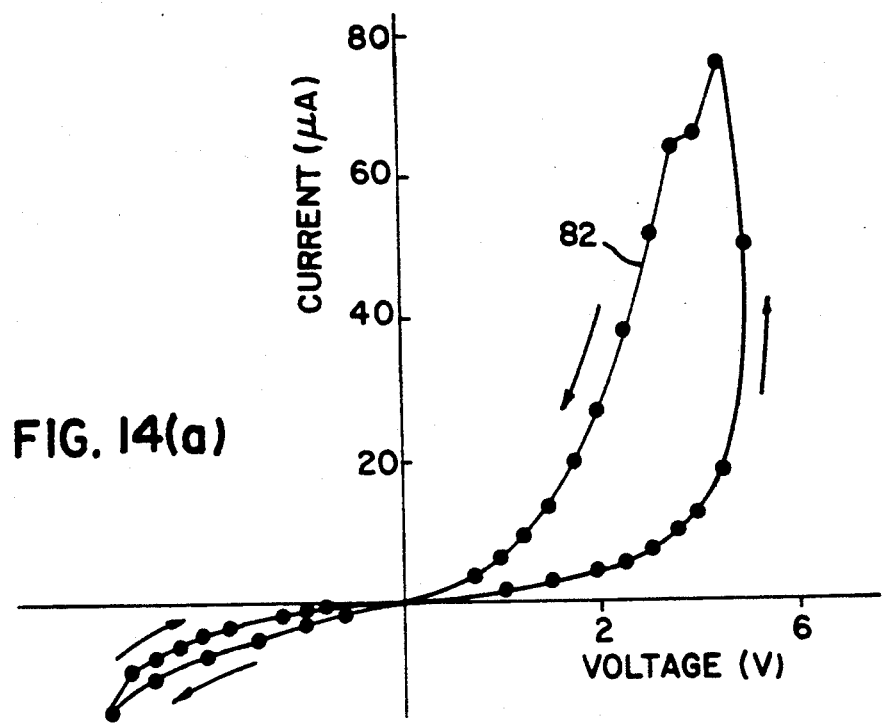
Figure 14B:
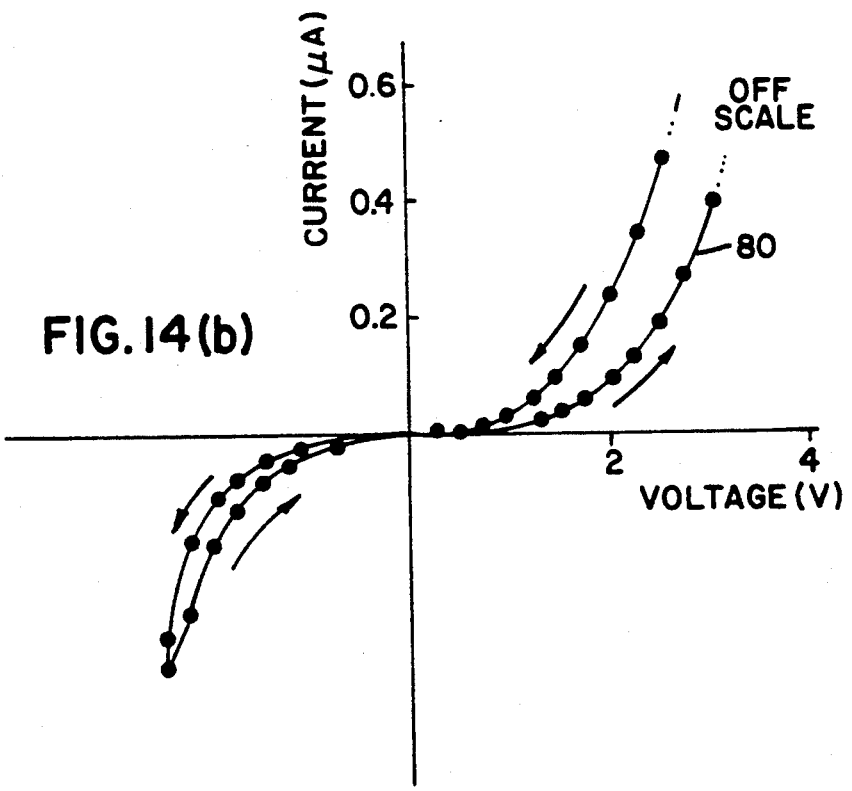
Figure 15:
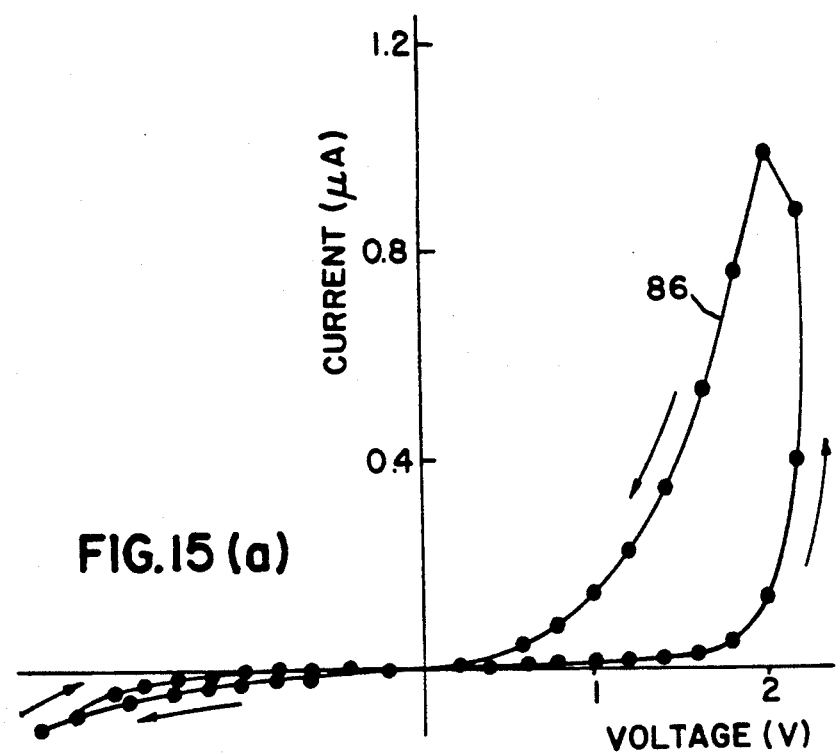
Figure 15:
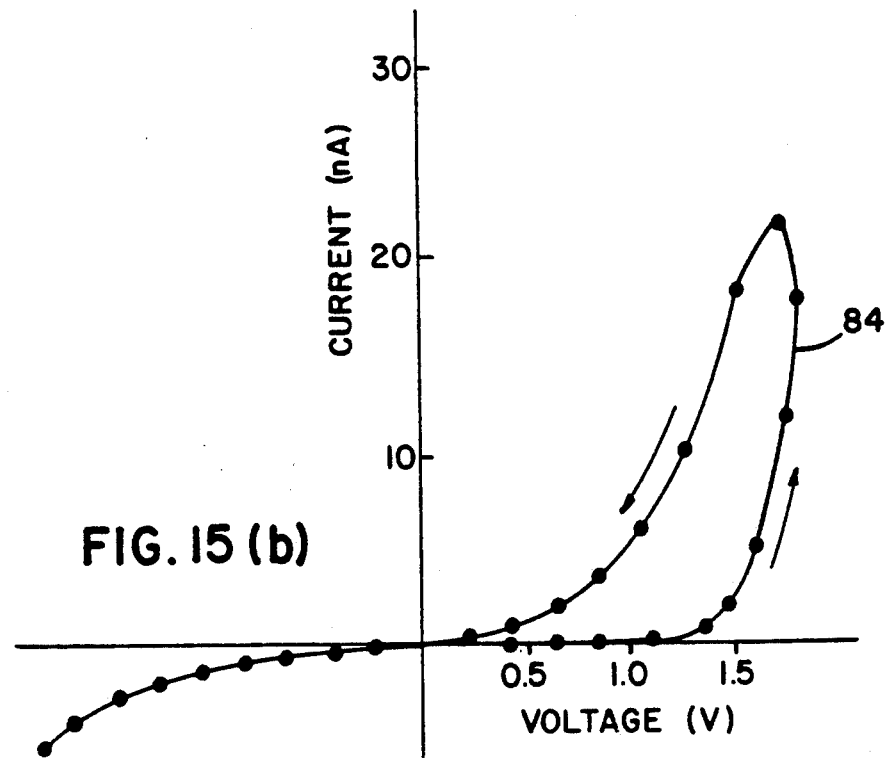

A dramatic change occurred in the high bias characteristics of the devices. The I/V characteristics of the two layer structure changed from asymmetric to symmetric, as shown in FIG. 14, indicating loss of the rectifying characteristics in the bilayer device. However this is not observed for the monolayer structure, which is seen in FIG. 15 to retain its I/V behavior asymmetry even after heating. This indicates that the most significant contribution to the I/V characteristics of the device is made by the number of LB monolayers in the organic layer. The initial I/V asymmetry exhibited by the as-prepared bilayer structure may be due to flaws in the deposition of some of the DDOP-C-BHTCNQ layers, which subsequent heating anneals to a symmetric bilayer structure. Control samples having no organic layer exhibited short circuit behavior rather than that shown in FIG. 14, reference numeral 82.

The low bias, linear conductance also changed in magnitude after heating the samples. The monolayer structure changed in conductance from about $10^{-8}$ $\Omega^{-1}$ to about $5 \times 10^{-9} \Omega^{-1}$ after one annealing cycle. A similar observation was seen with the bilayer structure, changing from about $10^{-6} \Omega^{-1}$ to about $10^{-8} \Omega^{-1}$ after one temperature cycle and to about $10^{-9}$ $\Omega^{-1}$ after three cycles. This change in conductance may be associated with structural changes and rearrangement in the LB layer, leading to a reduction in the number of trap sites which may provide conduction pathways through the film.

The beneficial effects of annealing on the monolayer device were also exhibited in unannealed devices which were repeatedly cycled at high voltages, as described above and shown in FIGS. 12-13. In contrast, similar repeated cycling at high voltages eliminated apparent rectifying behavior in bilayer devices in a manner similar to that achieved by annealing. This indicates that a type of rearrangement of the molecular array in the organic layer of both the monolayer and bilayer devices is effected by such repeated cycling, as is effected by annealing of the devices.

The following theory is proposed as an aid to understanding of the invention, and is not intended to be limiting to the scope thereof, which is defined by the appended claims. The difference in rectifying characteristics between the device including an odd number of monolayers of DDOP-C-BHTCNQ as the organic layer (e.g. the single monolayer device described above) and one containing an even number of monolayers (e.g. the bilayer device also described above) appears to be due to the arrangement of the monomolecular layers and their relationship to other materials within the device. In the single monolayer device, the molecules are arrayed with their TCNQ terminal moieties adjacent the magnesium electrode. From the known redox potentials ($-2.34$ V versus the normal hydrogen electrode for magnesium, and that given for bromohydroxyethoxy-TCNQ (BHTCNQ) by R.M. Metzger et al. (*J. Molecular Electronics 2*, 119 (1986))), an equilibrium constant of $10^{49}$ may be calculated for the reaction

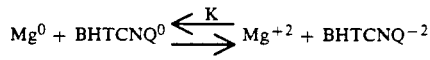

$$Mg^0 + BHTCNQ^0 \underset{\longrightarrow}{\overset{K}{\longleftarrow}} Mg^{+2} + BHTCNQ^{-2}$$

The same equilibrium constant may be assumed for the interaction between the organic layer and the magnesium when a magnesium/BHTCNQ interface is present. This implies the creation of a magnesium/magnesium salt interface in the devices in which the magnesium layer is deposited over TCNQ moieties of the organic layer, i.e. a device having a single monolayer or an odd number of monolayers as the organic layer. However, a magnesium/magnesium salt interface is not present in a device in which the magnesium layer is deposited over dodecyl moieties, i.e. a device having an even number of monolayers as the organic layer.

Also, it is necessary in a rectifier for one of the electrode interfaces to exhibit a high resistance (N. F. Mott et al., "Electronic Processes in Ionic Crystals" Chapter V, Oxford University Press, 2d edn. (1948)). In a device with, e.g., a platinum/dodecyl interface, a high resistance is encountered in the region of the interface between the organic layer and the lower electrode when a positive bias is applied. When a negative bias is applied, both contacts exhibit a high resistance. Thus, the single monolayer and odd number monolayer devices exhibit the high resistance at one electrode required for rectifying behavior.

EXAMPLE 3

Figure 3C:
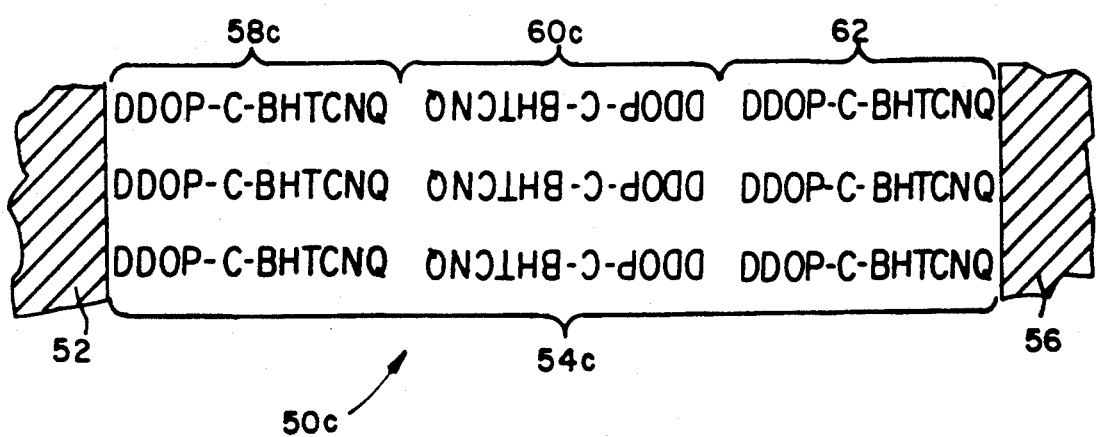
FIG. 3c illustrates schematicaaly the orientation of a double monomolecular layer, not according to the invention.

Fabrication of an MIM' Structure having an odd number of LB monolayers greater than one A glass supporting substrate about 625 mm² is prepared and metallized with a 1000 Å platinum lower electrode metal as described above for Examples 1-2. Three DDOP-C-BHTCNQ monolayers are then deposited from the water surface onto the platinum, also as described above. Once the subphase monolayer is compressed to the required pressure, the substrate is withdrawn from its starting position in the water in the trough to cross the air/water interface, resubmerged, and again withdrawn. The monolayer on the surface of the LB trough is held at constant pressure throughout the deposition of the three monomolecular layers onto the substrate. The sample is stored under desiccated conditions for a minimum of one week prior to the next step to aid in the removal of trapped water from the LB film. Typically for LB films, each layer is deposited with the molecules normal to the substrate surface with the dodecyl terminal moieties adjacent the metallized surface of the substrate, as shown in FIG. 3c, and the TCNQ moieties exposed. The resulting glass-electrode-organic structures are similar to that illustrated at reference numerals 22-28 in FIG. 1.

On removal from the desiccator, multiple circular counter electrodes, each a disk about 1 mm diameter by 1000 Å thick magnesium film, are deposited over the DDOP-C-BHTCNQ layers as described above for Examples 1-2. Care is taken not to permit contact of the platinum layer by the magnesium contacts, and to preserve the as-deposited characteristics of the organic film. A further silver layer is then deposited, as described above for Examples 1-2, to substantially cover each magnesium disc while avoiding direct contact with the organic film. Electrical contact is made to this top electrode in the same manner as described above for Examples 1-2 via a gallium-indium droplet and a gold wire. The resulting structure is similar to that illustrated at reference numerals 22-36 in FIGS. 1 and 2. In this Example contact 42 is also provided by a gallium-indium alloy.

The above-described organic monolayer MIM' device, in which the insulating layer is a DDOP-C-BHTCNQ monomolecular layer or an odd number of monomolecular layers, exhibits asymmetry in its I/V characteristics, indicative of rectifying behavior, which is reproducible over many cycles of voltage sweeps. Thus the method and device according to the present invention are useful for such devices as rectifiers, memory devices, switches, diodes, and transistors.

While there has been shown and described what are at present considered the preferred embodiments of the invention, it will be obvious to those skilled in the art that various changes and modifications can be made therein without departing from the scope of the invention as defined by the appended Claims.

We claim:

1. A method for fabricating a microelectronic device of the metal/insulator/metal' type wherein metal layers are separated by a film of organic material, said method comprising the steps of:

depositing on a surface of a conductive substrate a monomolecular layer of highly pure p-dodecyloxy-phenylcarbamate of 2-(2'-hydroxyethoxy)-5-bromo-7,7,8,8-tetracyanoquinodimethan to form an organic film on said surface, wherein molecules of said monomolecular layer are generally disposed normal to said surface with their dodecyl terminal moieties adjacent said surface;

depositing by vacuum evaporation onto said organic film an essentially oxide-free contiguous layer of magnesium, wherein said substrate and said organic film are Thus, in both the single and triple organic layers, and in maintained at a temperature below about 15° 1 C;

depositing a layer of silver on said magnesium layer to substantially cover and conductively adhere to said magnesium layer; and conductively adhering first electrically conductive lead means to said silver layer by means of a gallium-indium eutectic alloy.

2. A method in accordance with claim 1 further comprising the step of conductively adhering second electrically conductive lead means to a portion of said conductive substrate in such a way that said second lead means does not conductively contact said organic film.

3. A method in accordance with claim 1 wherein said monomolecular layer is deposited as a Langmuir-Blodgett film.

4. A method in accordance with claim 3 further comprising the step of annealing said device at about 60-70° C. for at least about 3 hr.

5. A method for fabricating a microelectronic device of the metal/insulator/metal' type wherein metal layers are separated by a film of organic material, said method comprising the steps of:

depositing on a surface of a first portion of a conductive substrate n monomolecular layers, wherein n is an odd integer greater than 1, of molecules of highly pure p-dodecyloxyphenylcarbamate of 2-(2'-hydroxyethoxy)-5-bromo-7,7,8,8-tetracyanoquinodimethan to from an organic film on said surface, wherein molecules of a first of said monomolecular layers are generally disposed normal to said first portion surface with their dodecyl terminal moieties adjacent said surface and their tetracyanoquinodi- methan terminal moieties distal from said first portion surface, and molecules of a second to an n-1 if saud monomolecular layers generally disposed normal to one of said monomolecular layers immediately therebelow with their terminal moieties adjacent like moieties of two of said monomolecular layers immediately adjacent thereto, and molecules of an n of said monomolecular layers generally disposed normal to said n-1 monomolecular layer immediately therebelow with its dodecyl terminal moieties adjacent like moieties of said n-1 monomolecular layer;

depositing by vacuum evaporation onto said organic film an essentially oxide-free contiguous layer of magnesium, wherein said substrate and said organic film are maintained at a temperature below about 15° C.;

depositing a layer of silver on said magnesium layer to substantially cover and conductively adhere to said magnesium layer; and conductively adhereing first electrically conductive lead means to said silver layer by means of a gallium-indium eutectic alloy.

6. A method in accordance with claim 5 wherein n is an odd integer of 3-21 inclusively.

7. A method in accordance with claim 5 further comprising the step of conductively adhering second electrically conductive lead means to a portion of said conductive substrate in such a way that said second lead means does not conductively contact said organic film.

8. A method in accordance with claim 5 wherein said monomolecular layers are deposited as Langmuir-Blodgett films.

9. A method in accordance with claim 8 further comprising the step of annealing said device at about 60-70° C. for at least about 3 hr.

* * * * *